US009778666B2

(12) United States Patent
Sobolewski

(10) Patent No.: US 9,778,666 B2
(45) Date of Patent: Oct. 3, 2017

(54) DYNAMIC CURRENT LIMIT APPARATUS AND METHOD

(75) Inventor: Gregory Sobolewski, Brecksville, OH (US)

(73) Assignee: Keithley Instruments, LLC, Solon, OH (US)

(*) Notice: Subject to any disclaimer, the term of this patent is extended or adjusted under 35 U.S.C. 154(b) by 302 days.

(21) Appl. No.: 13/591,534

(22) Filed: Aug. 22, 2012

(65) Prior Publication Data

US 2013/0285629 A1 Oct. 31, 2013

Related U.S. Application Data

(60) Provisional application No. 61/639,496, filed on Apr. 27, 2012.

(51) Int. Cl.
| H02H 9/02 | (2006.01) |
| G05F 1/56 | (2006.01) |
| G01R 1/36 | (2006.01) |
| G01R 19/12 | (2006.01) |

(52) U.S. Cl.
CPC ............ *G05F 1/56* (2013.01); *G01R 1/36* (2013.01); *H02H 9/025* (2013.01); *G01R 19/12* (2013.01)

(58) Field of Classification Search
CPC .......... H02H 9/025; G01R 1/36; G01R 19/12
USPC ....................................................... 361/93.9
See application file for complete search history.

(56) References Cited

U.S. PATENT DOCUMENTS

| 3,760,279 | A | * | 9/1973 | Rudolph | .............. | H02H 9/02 |
| | | | | | | 219/121.13 |
| 4,835,649 | A | * | 5/1989 | Salerno | ...................... | 361/18 |
| 5,444,358 | A | * | 8/1995 | Delepaut | .................. | 323/222 |
| 5,793,589 | A | * | 8/1998 | Friedl | ................ | H02H 3/445 |
| | | | | | | 307/131 |
| 5,898,844 | A | * | 4/1999 | Thompson | ........ | G06F 13/4081 |
| | | | | | | 361/58 |
| 6,049,447 | A | * | 4/2000 | Roesch et al. | .............. | 361/58 |
| 6,184,669 | B1 | * | 2/2001 | Matsuo | ................ | G05F 1/565 |
| | | | | | | 323/273 |
| 6,424,129 | B1 | * | 7/2002 | Lethellier | .......... | H02M 3/1584 |
| | | | | | | 323/272 |
| 2004/0076021 | A1 | * | 4/2004 | Miyamoto | ........ | H02M 3/3385 |
| | | | | | | 363/21.01 |
| 2008/0290882 | A1 | * | 11/2008 | Rogers | .................. | G01R 1/36 |
| | | | | | | 324/755.11 |
| 2011/0279941 | A1 | * | 11/2011 | Heckmann | ........ | H03K 17/165 |
| | | | | | | 361/93.1 |

* cited by examiner

*Primary Examiner* — Ronald W Leja
(74) *Attorney, Agent, or Firm* — Marger Johnson; Kevin Dothager

(57) ABSTRACT

A dynamic current limiter circuit is disclosed. The dynamic current limiter includes an input node an output node. The dynamic current limiter also includes a current control valve coupled between the input and output nodes, the current control valve being configured to limit current flow between the input and output nodes based on a control input. The dynamic current limiter also includes a current change detector coupled between the input and output nodes, the current change detector being configured to detect a change in current through the input and output nodes and generate a control signal configured to drive the control input. The current control valve is configured to limit current flow between the input and output nodes in response to the current control signal.

24 Claims, 6 Drawing Sheets

DYNAMIC CURRENT LIMIT APPARATUS AND METHOD

CROSS-REFERENCE TO PRIOR FILED APPLICATIONS

This application claims priority from earlier filed U.S. provisional application No. 61/639,496, entitled DYNAMIC CURRENT LIMIT, (Sobolewski), filed Apr. 27, 2012, which is incorporated herein in its entirety.

FIELD OF INVENTION

The present invention relates to electrical measurement equipment and, in particular, to circuits for use in measuring electrical current.

BACKGROUND

Device testing involves use of voltage or current sources, or combinations, such as SMUs. These sources are designed to precisely control output as required by user. Such control has limited bandwidth, and if load changes suddenly, it can cause an excessive amount of output current to flow through the device under test (DUT), potentially damaging the DUT.

SUMMARY OF THE INVENTION

The subject invention encompasses a circuit that adjusts its impedance in response to large signal DUT impedance transients while allowing full signal to flow through at a reduced frequency.

A first aspect of the invention is an embodiment in a device that limits dI/dt rate of change from a source through a load above a predetermined I level.

A second aspect of the invention is an embodiment in a device based on a series, two-wire arrangement of components providing dynamic, large signal current limiting.

A third aspect of the invention is an embodiment in a device based on an FET implementation using a low frequency signal coupling to source and high frequency coupling to gate to provide required signal control.

A fourth aspect of the invention is an embodiment in an adjustable current limiting device that shapes maximum allowed current transients through the DUT.

A dynamic current limiter circuit and method are disclosed. The dynamic current limiter includes an input node an output node. The dynamic current limiter also includes a current control valve coupled between the input and output nodes, the current control valve being configured to limit current flow between the input and output nodes based on a control input. The dynamic current limiter also includes a current change detector coupled between the input and output nodes, the current change detector being configured to detect a change in current through the input and output nodes and generate a control signal configured to drive the control input. The current control valve is configured to limit current flow between the input and output nodes in response to the current control signal.

The current control valve may be a field effect transistor (FET). The FET may be a depletion type metal-oxide-semiconductor FET (MOSFET). The current change detector may include a source resistor in parallel with a DC shorting element. The DC shorting element may be a diode. The DC shorting element may be an inductor.

The current change detector may include a timing element configured to control the timing of the control signal. The timing element may include a resistor and a capacitor circuit having a time constant. The dynamic current may also include a bi-directional current control valve and bi-directional current change detector. The bi-directional current control valve may include two field effect transistors (FETs). The bi-directional current change detector may include one source resistor in parallel with two DC shorting elements. The bi-directional current change detector may include two source resistors, each source resistor being in parallel with a DC shorting element.

A method of dynamically limiting current is also disclosed. The method includes detecting a change in current through an input and output node and generating a control signal configured to drive a control input of a current control valve. The method also includes limiting current flow between the input and output nodes in response to the current control signal.

The current may be limited by a control valve including a field effect transistor (FET). The FET may be depletion type metal-oxide-semiconductor FET (MOSFET). The change in current may be detected by a current change detector including a source resistor in parallel with a DC shorting element. The DC shorting element may include a diode. The DC shorting element may include an inductor.

The current change detector may include a timing element configured to control the timing of the control signal. The timing element may include a resistor and a capacitor circuit having a time constant. The current control valve may be a bi-directional current control valve and the current change detector may be a bi-directional current change detector. The bi-directional current control valve may include two field effect transistors (FETs). The bi-directional current change detector may include one source resistor in parallel with two DC shorting elements. The bi-directional current change detector may include two source resistors, each source resistor being in parallel with a DC shorting element.

DETAILED DESCRIPTION OF THE INVENTION

The circuitry and methods disclosed herein adjust impedance with large signal device under test (DUT) impedance transients while allowing full signal to flow through at a reduced frequency. Prior systems may produce high current output spikes when load changes suddenly, e.g., in breakdown tests. Such undesired spikes may cause damage to a device under test (DUT) or to a needle of a probe.

The disclosed circuitry and methods provide a solution that can be quickly retrofitted into existing systems. The disclosed approach does not affect DC current flow out of a test and measurement instrument but blocks high current spikes caused by sudden DUT impedance changes.

An important aspect of the disclosed approach is that it reduces unwanted energy dissipation in DUTs and probes caused by sudden load changes. Such changes in load have resulted in damage to probes or the DUT itself when tests were done without protection circuitry. In the past, resistors of 100 ohms or more have been used to eliminate such damage. This overly-simplistic approach limits the usefulness of the test equipment. Similar circuitry, based on single transistor current limit, has been implemented inside instruments to reduce high current output transients (when load impedance changes suddenly, for example during breakdown tests). Unfortunately, such circuitry needs to be integrated into the design of the instrument. The approach described herein, may be implemented internally or externally to an instrument. Due to two-wire nature of the subject design, the desired low current capability of the test equipment is not compromised.

The techniques disclosed herein supplant frequency/magnitude of signal independent current limits, fuses, polyfuses, big inductors, as well as the previously-mentioned resistor method used in prior systems.

Figure 1:
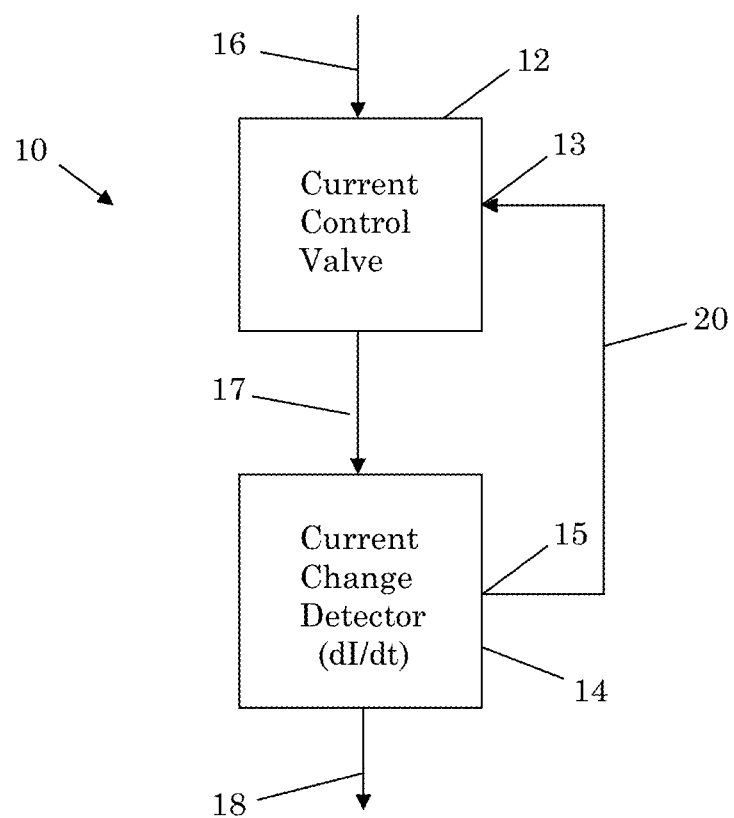
FIG. 1 is a block diagram of a dynamic current limiter.

FIG. 1 is a block diagram of a dynamic current limiter 10 including an input node or terminal shown generally by arrow 16 and an output node or terminal shown generally by arrow 18. In general, current flows through the dynamic current limiter 10 along the path defined by arrows 16, 17 and 18 (between the input and output nodes). A current control valve 12 is configured to limit current flow between the input and output nodes based on a control input 13. The dynamic current limiter 10 also includes a current change detector 14 configured to detect a change in current through the input and output nodes 16, 18 and generate a control signal 15. The control signal 15 is coupled to the control input 13 as shown by arrow 20. In general, under DC conditions, the control signal will be approximately zero. Accordingly, current control valve 12 will not limit current through the dynamic current limiter 10. When the current change detector 14 detects a change in current, the control signal 15 will become non zero and the current control valve 12 is configured to limit current through the input and output nodes 16, 18.

Figure 2:
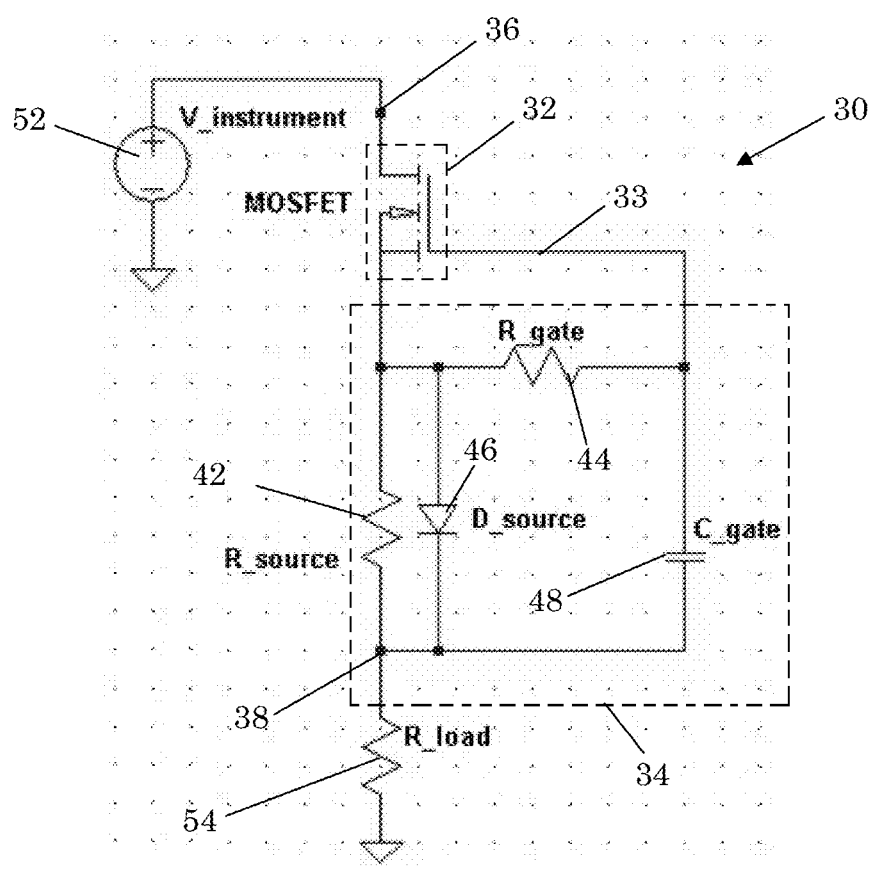
FIG. 2 is a schematic diagram of a dynamic current limiter using a diode based implementation.

FIG. 2 is a schematic diagram of a dynamic current limiter 30 using a diode based implementation. The dynamic current limiter 30 includes an input node or terminal 36 and an output node or terminal 38. In this example, the input node 36 is coupled to a test and measurement instrument (instrument) 52 and the output node 38 is coupled to a device under test (DUT), shown generally by load resistor 54. It should be understood that a variety of loads, e.g., resistive and/or inductive and/or capacitive, may be used without departing from the scope of this disclosure.

A current control valve 32 is configured to limit current flow through the input and output nodes 36, 38 based on a control input 33. The dynamic current limiter 30 also includes a current change detector 34 configured to detect a change in current through the input and output nodes 36, 38 and generate a control signal that is coupled to the control input 33. In general, under DC conditions, the control signal will be approximately zero. Accordingly, current control valve 32 will not limit current through the input and output nodes 36, 38. When the current change detector 34 detects a change in current, the control signal will become non zero and the current control valve 32 is configured to limit current through the input and output nodes 36, 38.

In this example, current control valve 32 is based on a depletion type metal-oxide-semiconductor field-effect transistor (MOSFET, although one skilled in the art will recognize that a JFET or enhancement MOSFET could also be used. Under DC or quiescent conditions, the current carrying capacity of this circuit limits is limited by the Idss of the MOSFET, which is typically selected to be above the maximum current that can be sourced by an instrument (V_instrument). Under DC or quiescent conditions the circuit resistance (measured between the input and output nodes) is effectively the source resistor 42 (R_source) in series with the current control valve 32 (MOSFET) on resistance.

In operation, a fast change of R_load 54 from high to low impedance will cause a change of voltage across the source diode 46 (D_source) which is coupled in parallel with a source resistor 42 (R_source). The source diode 46 basically functions as a DC shorting element. The source diode 46 should be selected to provide the proper voltage level to match the voltage level required at the gate of the MOSFET. It should be understood that source diode 46 may comprise more than one diode element. This parallel combination 42, 46 is coupled via a gate capacitor 48 (C_gate) to the control input 33 (the gate) and will generate a non-zero control signal at the control input 33. This will cause the current control valve 32 to conduct a reduced level of current, which will recover back to the full current carrying capacity (Idss) of the MOSFET with an RC time constant determined by gate resistor 44 and gate capacitor 48. The RC time constant should be set to be long enough to enable the current limiting circuitry of instrument 52 to take proper control of the instrument output.

Figure 3:
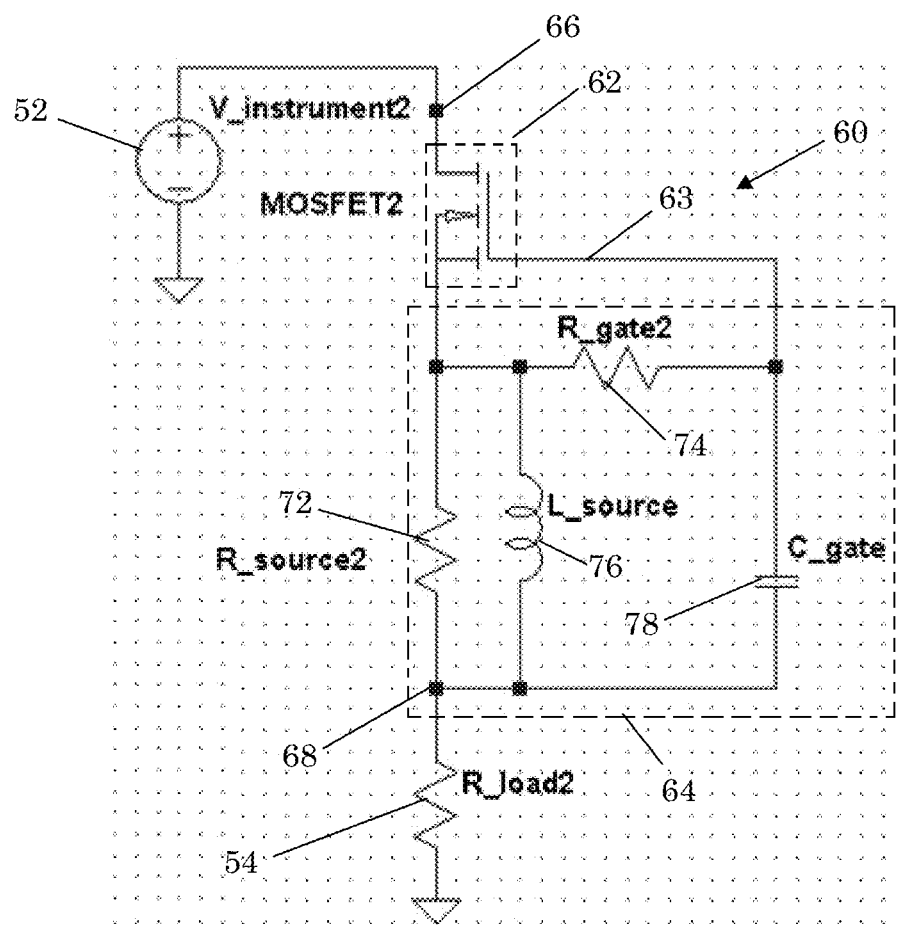
FIG. 3 is a schematic diagram of a dynamic current limiter using an inductor based implementation.

FIG. 3 is a schematic diagram of a dynamic current limiter 60 using an inductor based implementation. In this example, the parallel arrangement of the source resistor and source diode is replaced with a parallel arrangement of a source resistor 72 (R_source2) and a source inductor 76 (L_source). The source inductor 76 basically functions as a DC shorting element. The remaining elements of FIG. 3 serve the same purpose as described above in relation to FIG. 2. The dynamic current limiter 60 has an input node or terminal 66 and an output node or terminal 68. The dynamic current limiter 60 also includes a current change detector 64 configured to detect a change in current through the input and output nodes 66, 68 and generate a control signal that is coupled to the control input 63 of the current control valve 62.

Under DC or quiescent conditions, the source inductor 76 acts as a short circuit. A fast change of R_load 54 from high to low impedance will cause a change of voltage across the source inductor 76 which is coupled in parallel with a source resistor 42 (R_source). This parallel combination 72, 76 is coupled via a gate capacitor 78 to the control input 63 (the gate) of the current control valve 62 and will generate a non-zero control signal at the control input 63. This will cause the current control valve 62 to conduct a reduced level of current, which will recover to full current carrying capacity (Idss) of the MOSFET with an RC time constant determined by gate resistor 74 and gate capacitor 78. As explained above, the RC time constant should be set to be long enough to enable the current limiting circuitry of instrument 52 to take proper control of the instrument output.

Both designs in FIGS. 2 and 3 are configured for conducting current in a single direction only. It should be noted that either of the designs (FIG. 1 or FIG. 2) may be used in a back-to-back configuration to suppress transients in both directions.

Figure 4A:
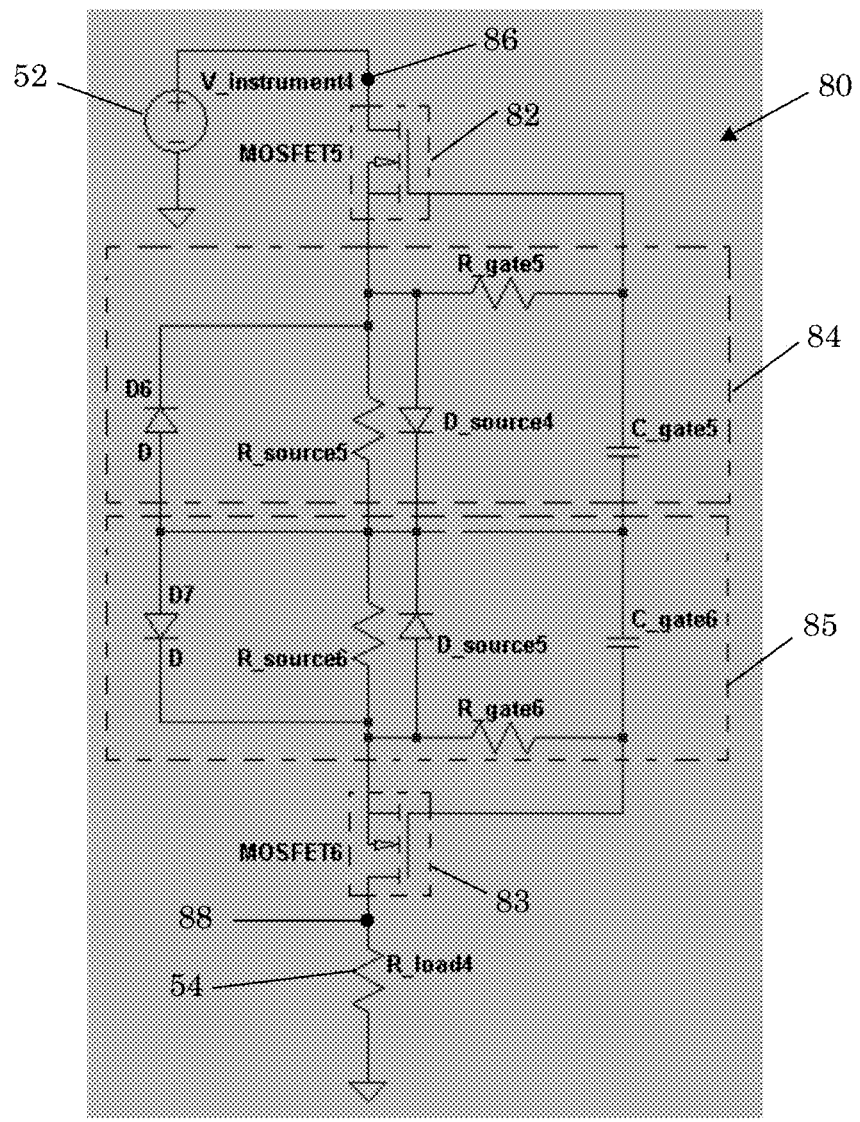
FIG. 4A is a schematic diagram of a bi-directional dynamic current limiter.

For example, FIG. 4A is a schematic diagram of a bi-directional dynamic current limiter 80. The bi-directional dynamic current limiter 80 includes an input node or terminal 86 and an output node or terminal 88. In this example, the input node 86 is coupled to a test and measurement instrument (instrument) 52 and the output node 88 is coupled to a device under test (DUT), shown generally by load resistor 54. The "current control valve" actually includes first and second current control valves 82, 83, configured to limit current flow based on their associated control inputs as discussed above. The bi-directional dynamic current limiter 80 includes a "bi-directional current change detector" that includes a first current change detector 84 coupled to current control valve 82 and a second current change detector 85 coupled to current control valve 83. In operation, the bi-directional dynamic current limiter 80 functions as described above in connection with FIG. 2 and provides the capability to limit current flow in both directions.

Figure 4B:
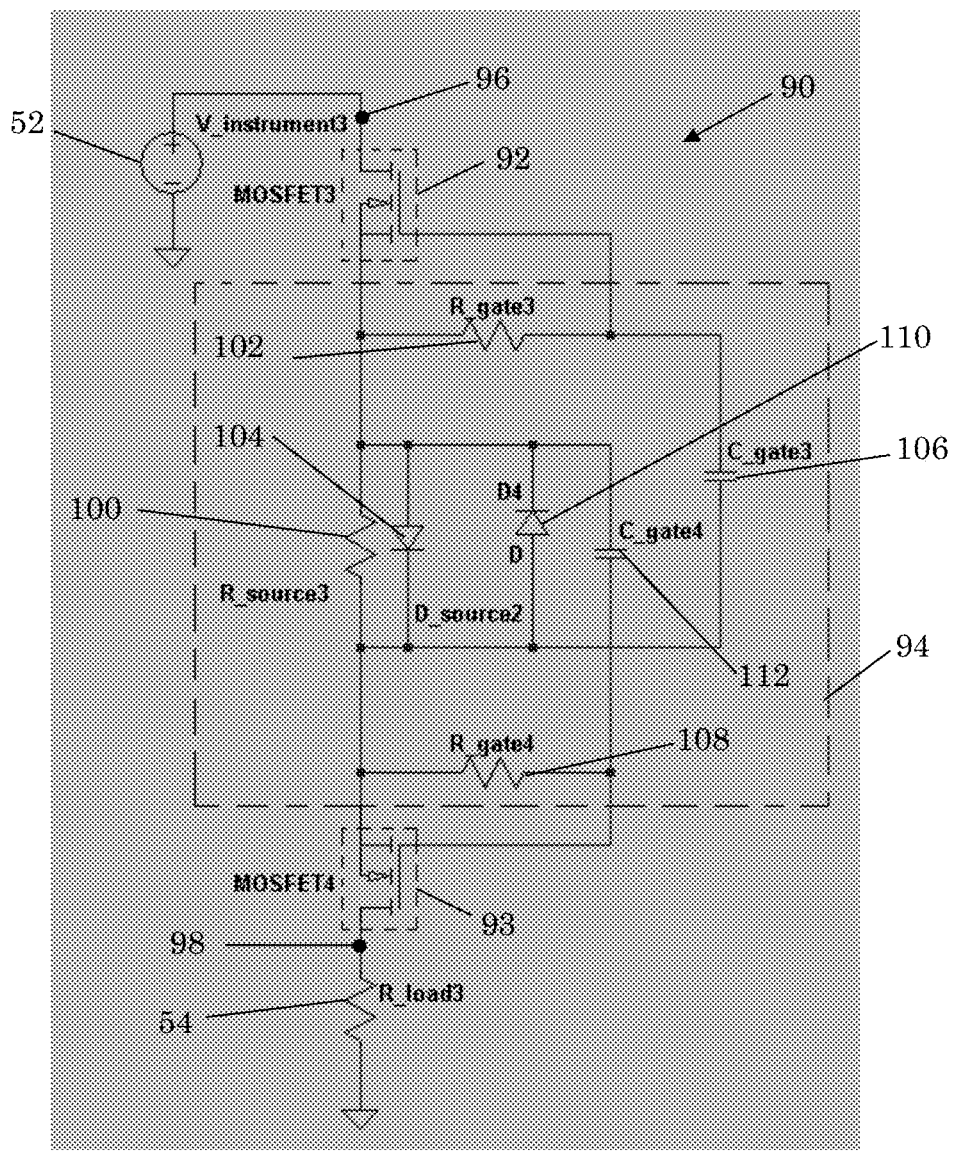
FIG. 4B is a schematic diagram of another bi-directional dynamic current limiter.

FIG. 4B is a schematic diagram of another bi-directional dynamic current limiter 90. The bi-directional dynamic current limiter 90 includes an input node or terminal 96 and an output node or terminal 98. In this example, the input node 96 is coupled to a test and measurement instrument (instrument) 52 and the output node 98 is coupled to a device under test (DUT), shown generally by load resistor 54. The current control valve includes first and second current control valves 92, 93, configured to limit current flow based on their associated control inputs as discussed above. The bi-directional dynamic current limiter 90 includes a bidirectional current change detector 94 coupled to current control valves 92, 93. In the positive current direction, e.g., top to bottom, the following components are active: source resistor 100, gate resistor 102, source diode 104, and gate capacitor 106. In the negative current direction, e.g., bottom to top, the following components are active: source resistor 100, gate resistor 108, source diode 110, and gate capacitor 112. In operation, the bi-directional dynamic current limiter 90 functions as described above in connection with FIG. 2 and provides the capability to limit current flow in both directions.

It should also be understood that the diodes in FIGS. 4A and 4B may be replaced by inductors as shown in FIG. 3. Is should also be understood that while depletion type MOSFETs were used in the embodiments above, enhancement types could also be utilized, although such a change would require a floating supply to power the gate.

In circuitry according to the configurations disclosed above, transient current that will feed through the circuitry will be determined by Crss and Coss of the MOSFET and can be reduced by a relatively small inductor/resistor in series with the output of instrument (V_instrument).

In circuitry according to the configurations disclosed above, is also important to note that the control path to the I-limiting (i.e., current-limiting) device (i.e., the gate of the MOSFET in this case) is coupled to the load via a device that has a reduced impedance at high frequency, e.g., a capacitor, while the current channel path produces a voltage proportional to current but independent of frequency, e.g., diode/resistor, or a voltage that increases with signal frequency in the case of an inductor.

Figure 5:
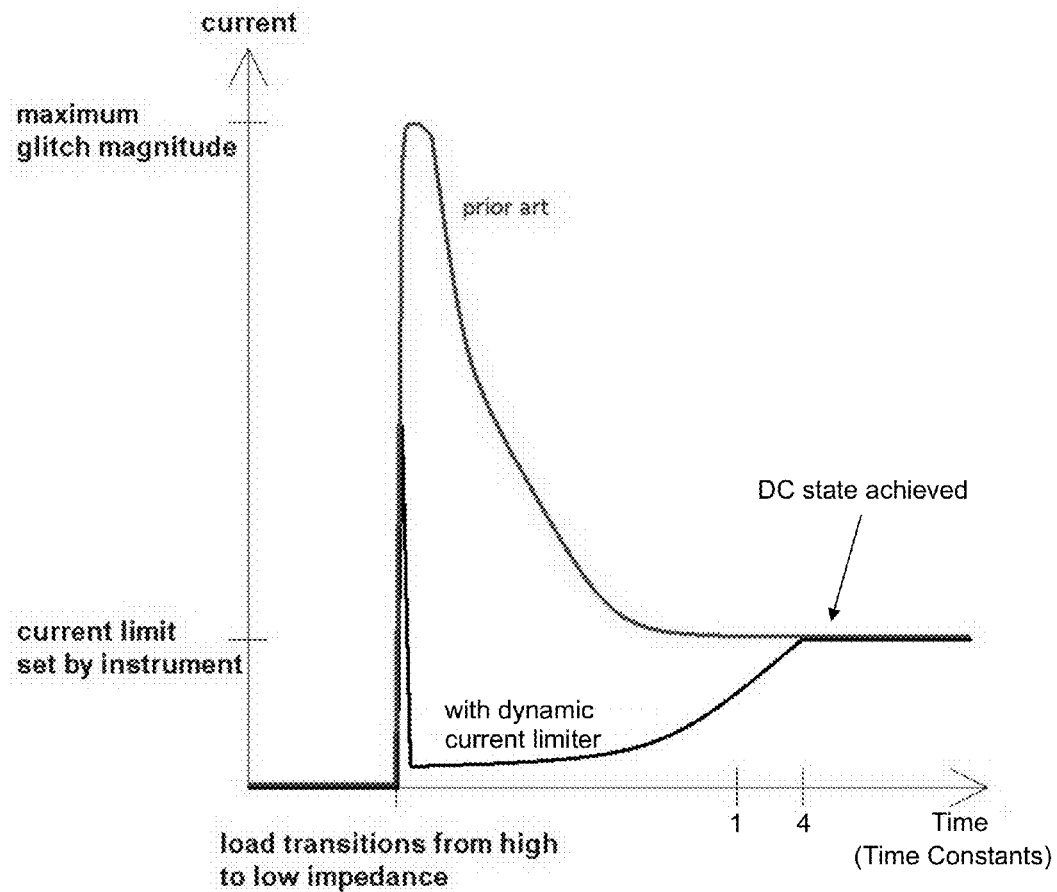
FIG. 5 is a simplified graph showing the response of a dynamic current limiter as compared to a conventional system.

FIG. 5 (not to scale) is a simplified graph showing the response of the dynamic current limiter as compared to a conventional system. The dynamic current limiter reduces the initial glitch when the load transitions from a high impedance to a low impedance, as compared to prior systems. The current flow through the dynamic current limiter smoothly transitions to a DC level (determined by the load impedance) within several time constants, e.g., 1 time constant=~63% of DC level . . . 4 time constants=~98% DC level.

It should be understood that many variations are possible based on the disclosure herein. Although features and elements are described above in particular combinations, each feature or element can be used alone, without the other features and elements, or in various combinations with, or without, other features and elements.

What is claimed is:

1. A dynamic current limiter comprising:
an input node configured to be coupled with a test and measurement instrument;
an output node configured to be coupled with a device under test;
a current control valve coupled between the input and output nodes, the current control valve being configured to limit current flow received from the test and measurement instrument based on a control input; and
a current change detector coupled with the current control valve and the output node, the current change detector configured to:
detect a change in current provided by the test and measurement instrument, and
in response to the detected change in current, generate a control signal configured to drive the control input of the current control valve, the current change detector including a source resistor in parallel with a DC shorting element and a timing element configured to control the timing of the control signal in accordance with a time constant, the time constant configured to allow time for current limiting circuitry of the test and measurement instrument to establish current control, wherein the source resistor and the DC shorting element are coupled to the control input via the timing element.

2. The dynamic current limiter of claim 1 wherein the current control valve is a field effect transistor (FET).

3. The dynamic current limiter of claim 2 wherein the FET is a depletion type metal-oxide-semiconductor FET (MOSFET).

4. The dynamic current limiter of claim 2, wherein the current carrying capacity of the FET is the maximum current that flows through the FET with a gate voltage of zero (0).

5. The dynamic current limiter of claim 1 wherein the DC shorting element is a diode.

6. The dynamic current limiter of claim 1 wherein the DC shorting element is an inductor.

7. The dynamic current limiter of claim 1 wherein the timing element includes a resistor and a capacitor.

8. The dynamic current limiter of claim 1, further comprising a bi-directional current control valve and bi-directional current change detector.

9. The dynamic current limiter of claim 8 wherein the bi-directional current control valve includes two field effect transistors (FETs).

10. The dynamic current limiter of claim 8 wherein the bi-directional current change detector includes one source resistor in parallel with two DC shorting elements.

11. The dynamic current limiter of claim 8 wherein the bi-directional current change detector includes two source resistors, each source resistor being in parallel with a DC shorting element.

12. The dynamic current limiter of claim 1, wherein the dynamic current limiter is in a two-wire configuration.

13. The dynamic current limiter of claim 12, wherein the dynamic current limiter is configured to be retrofitted between the test and measurement instrument and the device under test.

14. A method of dynamically limiting a current provided to a device under test, the method comprising:
   detecting, by a current change detector of a dynamic current limiter, an increase in current received from a test and measurement instrument;
   in response to detecting the increase in current, generating, by the current change detector, a control signal that drives a control input of a current control valve of the dynamic current limiter to cause the current control valve to limit the current provided to the device under test; and
   transitioning, in accordance with a timing element of the current change detector, the current control signal to cause the dynamic current limiter to enter a quiescent state over a period of time that enables current limiting circuitry of the test and measurement instrument to establish current control.

15. The method of claim 14, wherein the the current control valve is a field effect transistor (FET).

16. The method of claim 15, wherein the FET is a depletion type metal-oxide-semiconductor FET (MOSFET).

17. The method of claim 14, wherein the timing element includes a resistor and a capacitor.

18. The method of claim 14, wherein the current control valve is a bi-directional current control valve and the current change detector is a bi-directional current change detector.

19. The method of claim 18, wherein the bi-directional current control valve includes two field effect transistors (FETs).

20. The method of claim 18, wherein the bi-directional current change detector includes one source resistor in parallel with two DC shorting elements.

21. The method of claim 18, wherein the bi-directional current change detector includes two source resistors, each source resistor being in parallel with a DC shorting element.

22. The dynamic current limiter of claim 14, wherein a current limit of the quiescent state is based on a current carrying capacity of the current control valve.

23. The dynamic current limiter of claim 22, wherein to drive the control input of the current control valve causes the current control valve to:
   reduce the current provided to the device under test, and
   transition, in accordance with the timing element, the current provided to the device under test to a steady state, wherein the current provided to the device under test at the steady state is limited based on a current carrying capacity of the current control valve.

24. The dynamic current limiter of claim 23, wherein the timing element includes a gate resistor coupled with a gate capacitor, the gate resistor coupled with an input of the source resistor and an input of the DC shorting element, and the capacitor coupled with an output of the source resistor and an output of the DC shorting element.

* * * * *